United States Patent [19]

Ownby et al.

[11] 4,292,093

[45] Sep. 29, 1981

[54] METHOD USING LASER IRRADIATION FOR THE PRODUCTION OF ATOMICALLY CLEAN CRYSTALLINE SILICON AND GERMANIUM SURFACES

[75] Inventors: Gary W. Ownby, Knoxville; Clark W. White, Oak Ridge; David M. Zehner, Lenoir City, all of Tenn.

[73] Assignee: The United States of America as represented by the United States Department of Energy, Washington, D.C.

[21] Appl. No.: 108,199

[22] Filed: Dec. 28, 1979

[51] Int. Cl.³ .................. H01L 21/265; H01L 21/22
[52] U.S. Cl. ........................... 148/4; 148/1.5; 148/187; 357/91; 427/53.1
[58] Field of Search .............. 148/1.5, 187, 4, 13; 357/91; 219/121; 427/53.1, 86

[56] References Cited

U.S. PATENT DOCUMENTS

| | | | |
|---|---|---|---|
| 3,940,289 | 2/1976 | Marquardt et al. | 148/1.5 |
| 4,044,222 | 8/1977 | Kestenbaum | 219/121 LM |
| 4,056,642 | 11/1977 | Saxena et al. | 427/84 |
| 4,155,779 | 5/1979 | Auston et al. | 148/1.5 |

OTHER PUBLICATIONS

Bell et al., in "Laser–Solid Interactions & Laser Processing"-1978, AIP Conf. #50, Feb. 1979, N.Y. p. 299.
Bean et al., J. Appl. Phys. 50, (1979) 881.
Tsu et al., Phys. Rev. Letts. 42 (May 1979) 1356.
Bedair et al., J. Appl. Phys. 40 (1969) 4776.
Auston et al., Appl. Phys. Letts., 34 (May 1979) 558.
Lysenko et al., Phys. Stat. Solid, 49(a) (1978) 405.
Auston et al., Bell Lab. Records, (Aug. 1979) p. 187–191.
Csepregi et al., J. Appl. Phys. 48 (1977) 4234.
Roberts, R. W., Brit. J. Appl. Phys. 14 (1963) 537.
White et al., Science, 204 (1979) 461.
Narayan et al., J. Appl. Phys. 49 (1978) 3912.
Marabito et al., Surf. Sci. 49 (1975) 318.
Aston et al., Appl. Phys. Lett. 33 (1978) 437.
Narayan, J. Appl. Phys. Letts. 34 (1979) 312.

Primary Examiner—Upendra Roy
Attorney, Agent, or Firm—Fred O. Lewis; Stephen D. Hamel; Richard G. Besha

[57] ABSTRACT

This invention relates to a new method for removing surface impurities from crystalline silicon or germanium articles, such as off-the-shelf p- or n-type wafers to be doped for use as junction devices. The principal contaminants on such wafers are oxygen and carbon. The new method comprises laser-irradiating the contaminated surface in a non-reactive atmosphere, using one or more of Q-switched laser pulses whose parameters are selected to effect melting of the surface without substantial vaporization thereof. In a typical application, a plurality of pulses is used to convert a surface region of an off-the-shelf silicon wafer to an automatically clean region. This can be accomplished in a system at a pressure below $10^{-8}$ Torr, using Q-switched ruby-laser pulses having an energy density in the range of from about 60 to 190 MW/cm².

6 Claims, 6 Drawing Figures

Si (100)

LASER ANNEALED

THERMALLY ANNEALED 49 eV

LASER ANNEALED Si (100)

1 PULSE

5 PULSES

10 PULSES 49 eV

METHOD USING LASER IRRADIATION FOR THE PRODUCTION OF ATOMICALLY CLEAN CRYSTALLINE SILICON AND GERMANIUM SURFACES

The invention is a result of a contract with the U.S. Department of Energy.

BACKGROUND OF THE INVENTION

1. Field of the Invention

This invention relates generally to methods for treating contaminated crystalline surfaces to render them atomically clean. More particularly, it relates to a method for removing surface contaminants, such as oxygen and carbon, from silicon and germanium in order to achieve clean, well-ordered surfaces.

2. Problem

In the preparation of crystalline silicon and germanium articles for research and industrial applications, it is important from the standpoint of electrical properties that the surfaces be both clean and well-ordered. That is, it is important that the surface be as free as possible from impurities and that the near-surface layer have a structure approximating its as-grown structure. Various techniques have been employed for the cleaning of crystalline silicon and germanium surfaces but none of them has been as rapid and effective as desired. The conventional cleaning techniques for such surfaces include the following: in-vacuum sputtering followed by thermal annealing (probably the most extensively used technique at present), in-vacuum cleavage, in-vacuum evaporation, chemical etching, and electron scrubbing. [R. W. Roberts. *British Journal of Applied Physics* 14, 537 (1963)] Although sputtering, as with an ion beam, removes impurities from such surfaces, it must be followed by an annealing operation to convert the resulting amorphous surface to a well-ordered structure. Usually, the sputtering-and-annealing cycle is repeated several times, and the total cleaning time for a typical off-the-shelf wafer is a matter of hours.

The use of a pulsed laser beam to remove sulfur and oxygen from nickel-crystal surfaces is reported in the following reference: *Journal of Applied Physics* 40, No. 12, pp. 4776–4781 (1969). The degree of removal of the impurities was determined by comparing before-and-after low-energy electron diffraction patterns (LEED patterns) for the nickel surface. However, no spectroscopic techniques capable of identifying the atomic species or the quantities of such species present in the surface region were used. The same reference also describes an experiment in which a surface of a silicon crystal was irradiated with laser pulses. In that experiment, however, the crystal was throughly cleaned *before* irradiation. That is, prior to irradiation the crystal was (a) mechanically polished, (b) chemically polished, and (c) annealed at 1000°C. for 6 hours (to remove absorbed gases). LEED patterns of the resulting cleaned surface were obtained before and after irradiation. The reference does not assert or imply that cleaning of the silicon was effected by the irradiation. In fact, it is well known in the surface-physics art that—with respect to silicon, at least—LEED patterns do not reflect the presence or absence of particular atomic species.

The use of pulsed laser beams to process silicon crystals is described in various patents and the references cited therein, including the following: U.S. Pat. No. 4,147,563, "Method for Forming P-N Junctions and Solar Cells by Laser-Beam Processing," Apr. 3, 1979; U.S. Pat. No. 4,181,538 (Ser. No. 945,925), "Method for Making Defect-Free Zone by Laser-Annealing of Doped Silicon," filed on Sept. 26, 1978; U.S. patent application Ser. No. 80,725, "Method of Producing Ohmic Contacts on Semiconducting Oxides," filed on Sept. 25, 1979; and U.S. patent application Ser. No. 96,871, "Method Utilizing Laser-Processing for the Growth of Epitaxial P-N Junctions," filed on Nov. 23, 1979.

3. Objects of the Invention

Accordingly, it is an object of this invention to provide a novel method for removing surface impurities from crystalline germanium and silicon surfaces.

It is another object to provide a novel method for preparing clean crystalline silicon and germanium to be used in semiconductor applications.

It is another object to provide a novel method for converting crystalline silicon and germanium surfaces contaminated with macro amounts of oxygen and/or carbon to surfaces which are atomically clean with respect to those contaminants.

It is another object to provide a rapid and reliable method for efficiently removing impurities—e.g., oxygen and carbon—from a surface of a crystalline silicon or germanium article.

Other objects, advantages, and novel features will become apparent from the description and the figures.

SUMMARY OF THE INVENTION

In a typical application, the invention is used to clean a silicon or germanium crystal having a surface region which is contaminated with macro amounts of oxygen and carbon. In accordance with the invention, the region is irradiated in a non-reactive atmosphere with a plurality of laser pulses, each effecting substantially no volatilization of said crystal and generating a melt front which moves (a) through said region, (b) into the portion of the silicon body contiguous with said region, and (c) back to the surface of said region.

DESCRIPTION OF THE PREFERRED EMBODIMENT

Figure 1:
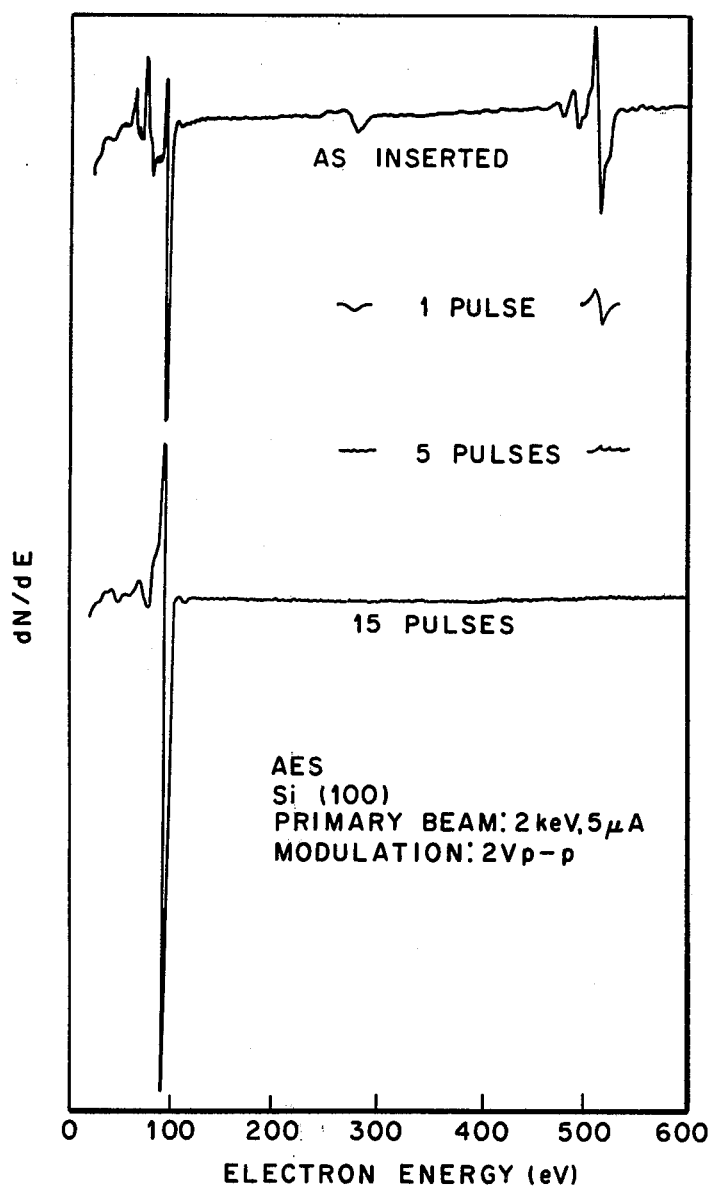
FIG. 1 presents a series of Auger spectra showing the decrease in surface impurities for an off-the-shelf single-crystal silicon sample treated by the method of this invention. The Auger analysis is sensitive to all elements except helium and hydrogen. The term dN/dE represents the rate of change in the number of electrons emitted from the surface as a function of energy.

This invention is generally applicable to the removal of impurities from crystalline silicon or germanium surfaces. It will be illustrated below as utilized for the removal of surface impurities from off-the-shelf p- or n-type crystal surfaces intended for use in semiconductor junction devices, such as transistors and solar cells. With respect to oxygen contamination of such surfaces, the term "macro" is used herein to refer to surfaces contaminated with more than $1.0 \times 10^{15}$ atoms/cm$^2$. With respect to carbon contamination of crystal surfaces, "macro" is used herein to refer to carbon concentrations exceeding the same value—i.e., $1.0 \times 10^{15}$ atoms/cm$^2$. The term "atomically clean" is used herein to refer to surfaces where carbon and oxygen are present in amounts corresponding to less than 1% of a monolayer.

Our invention is an offshoot of an investigation to determine the surface structure obtained by laser-annealing single-crystal silicon in vacuum. We have found that, under selected conditions, laser pulses can be used to convert a typical off-the-shelf (uncleaned) crystalline silicon surface to an atomically clean surface. For example, in accordance with our method we have cleaned off-the-shelf single-crystal silicon by irradiating it with five identical laser pulses, in vacuum. Before irradiation, it was determined that the silicon surface was contaminated with chemically bound oxygen (approximately 20 Å of SiO$_2$) and with approximately $3 \times 10^{15}$ atoms/cm$^2$ of carbon. After 5 laser pulses, the Auger electron intensities arising from C and O Auger transitions were reduced to the detection limit. So far as we are aware, this order of cleanliness has not been achieved previously with off-the-shelf silicon.

The following examples illustrate our method in greater detail. Referring to examples 1–5 in general, the off-the-shelf samples to be cleaned were derived from Czochralski-grown single-crystal silicon of the p-type (doped with boron) or of the n-type (doped with phosphorus). The samples had been exposed to atmosphere, and the principal surface contaminants were oxygen and carbon. As determined by 2.5 MeV He+ Rutherford backscattering techniques, the typical sample showed oxygen and carbon concentrations of $8.1 \times 10^{15}$ and $3.5 \times 10^{15}$ atoms/cm$^2$, respectively, in the near-surface region. Assuming a bulk SiO$_2$ stoichiometry of $2 \times 10^{22}$/cm$^3$, the corresponding thickness of the oxide layer is 20 Å. The sample-cleaning experiments were conducted in a standard ultra-high-vacuum system containing four-grid LEED optics for monitoring surface structure by observation of diffraction patterns and also containing a single-pass cylindrical mirror analyzer for monitoring surface impurities by conventional AES. [Levels of impurity contamination are quoted in terms of the ratios of the peak-to-peak signals of the impurity Auger transitions to the Si-L$_{23}$VV Auger transition at 91 eV as measured in the derivative (dN/dE) mode.] The vacuum system was provided with a glass window for coupling light from a standard Q-switched ruby laser (Model 35, manufactured by Apollo Lasers, Inc.). After insertion in the vacuum chamber, the chamber was baked out at 250° C. for 6 hours to achieve an ultra high vacuum environment. Unless indicated below, the pressure in the system following bakeout and before irradiation was less than $2 \times 10^{-10}$ Torr. After bakeout, the typical sample was irradiated with one or more identical laser pulses (beam diameter, approximately 3.5 mm), using the single-mode (TEM$_{oo}$) output of the laser at energy densities specified in the examples. The energy densities were determined by measuring the photon energy delivered through an aperture of known diameter positioned in front of a calorimeter and by correcting for the reflectivity of the window. A pulse duration of $15 \times 10^{-9}$ seconds was used in the experiments. Citations of peak-power densities are based on the following: For a Gaussian-shaped pulse, the peak power (in watts) is defined as the total energy in the pulse (in joules) divided by the FWHM (in sec) MW/cm$^2 \approx$ J/cm$^2 \times 67$.

EXAMPLE 1

Figure 2A:
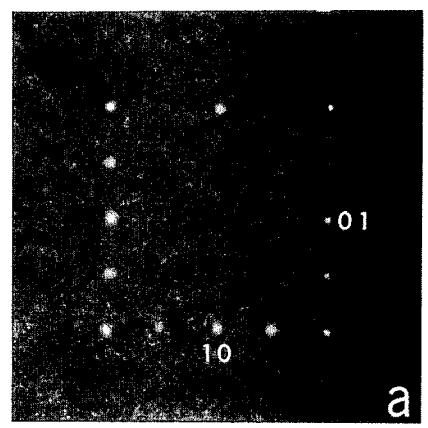
FIG. 2a is a LEED pattern (primary beam energy, 49 eV) for the sample referred to in FIG. 1, after that sample had been irradiated with five identical laser pulses.
Figure 2B:
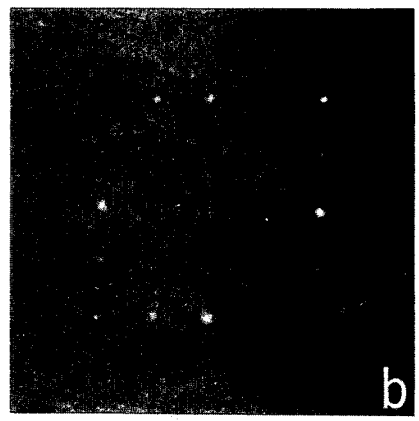
FIG. 2b is a LEED pattern of a sample identical to the off-the-shelf sample referred to in FIG. 1 after cleaning by sputter-annealing rather than by the method of this invention.
Figure 3A:
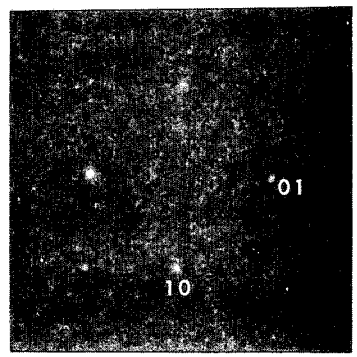
FIGS. 3a, 3b, and 3c are LEED patterns for the sample referred to in FIG. 1, after treatment with various numbers of laser pulses in accordance with the invention.
Figure 3B:
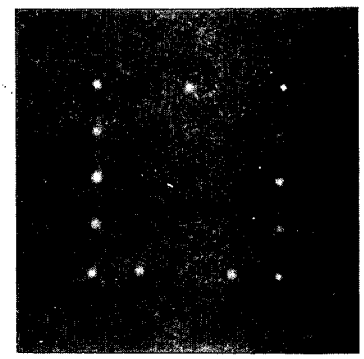
Figure 3C:
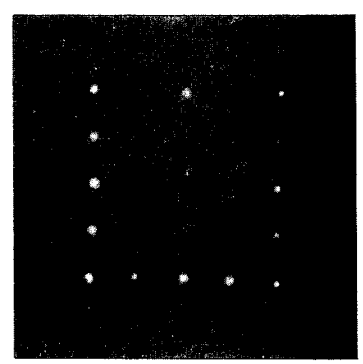

The oxygen- and carbon-contaminated sample (see above) for this run was a (100) crystal of the p type. LEED examination of the as-inserted sample showed that diffraction spots could be observed only at relatively high energies (>250 eV), indicating that a disordered layer was present at the surface. AES measurements showed the presence of macro amounts of both oxygen [0(510 eV)/Si(91 eV)=$2.3 \times 10^{-1}$] and carbon [C(272 eV)/Si(91 eV)=$3.8 \times 10^{-2}$] in the near-surface region. After one laser pulse at approximately 2.0 J/cm$^2$ (i.e., 133 MW/cm$^2$), a well-defined (2×1) LEED pattern (FIG. 3a) with moderate background intensity was obtained and Auger spectra (FIG. 1) demonstrated a factor-of-five reduction in the oxygen and carbon levels. Improvement in the quality of the diffraction pattern and a reduction in the levels of the contaminants occurred with additional laser pulses. After four additional pulses identical to the first, the LEED pattern shown in FIG. 2a was observed, and Auger spectra (FIG. 1) indicated a reduction in the oxygen (O/Si $\leq 8.0 \times 10^{-4}$) and carbon (C/Si $\leq 8.5 \times 10^{-4}$) levels to within the detection limits of the spectrometer—i.e., <0.1% of a monolayer impurity. That is, the initial impurity levels for oxygen and carbon had been reduced by factors of approximately 500 and approximately 50, respectively. No detectable change of the LEED pattern was observed after five more pulses, as illustrated in FIGS. 3b and 3c. The LEED pattern (FIG. 2a) for the sample treated with five laser pulses was compared with that (FIG. 2b) obtained after an identical sample was cleaned by conventional sputter-annealing techniques. The patterns exhibit the same structure. In other words, the ultraclean laser irradiated surface treated with five laser pulses had a well-ordered structure suitable for semiconductor applications. Samples of (110) and (111) orientation also were laser-cleaned in similar fashion and then examined. Similar results with respect to surface cleaning and well-ordered surface structures were obtained with all three orientations.

EXAMPLE 2

After insertion into the UHV system, no diffraction spots could be observed from a (111) oriented Si sample which contained quantities of O and C in the surface region similar to those illustrated in FIG. 1. Following irradiation with one laser pulse at approximately 2.8 J/cm$^2$, a good LEED pattern indicative of a well-ordered surface was observed. The AES spectrum indicated a reduction in the O and C concentration levels by a factor of approximately 6. Irradiation with four additional pulses produced a surface from which an excellent LEED pattern was obtained and the AES spectrum showed the O(O/Si$\leq 5.5 \times 10^{-4}$) and C(C/Si$\leq 7.6 \times 10^{-4}$) to again be within the detection limits of the spectrometer. These concentration levels are slightly smaller than those obtained after irradiation of the (100) surface with 5 laser pulses at an energy density of approximately 2.0 J/cm$^2$. Optical examination of the sample after removal from the UHV system showed no evidence of any surface damage.

EXAMPLE 3

After insertion into the UHV system a (100) oriented Si sample was irradiated with one laser pulse at an energy density of approximately 3.2 J/cm$^2$. Subsequent examination of the sample showed the irradiated area to contain small craters or burn marks indicative of surface damage (vaporization). The diffraction pattern obtained from this area was of poor quality as a result of the disordered surface. These combined observations indicate this power density to be unacceptable for producing well annealed surface layers.

EXAMPLE 4

After insertion into the UHV system a (111) oriented Si sample was sputtered with 1000 eV Ar ions to reduce the O concentration by a factor of 3. Little reduction was observed in the C Auger signal and an Auger signal from implanted Ar was easily detectable. No Leed pattern could be observed at this stage due to the amorphous region present at the surface as a result of sputtering. The sample was then irradiated with one laser pulse at an energy density of approximately 0.32 J/cm$^2$ (i.e., 21 MW/cm$^2$). A LEED pattern indicative of a well-ordered surface was subsequently observed. An examination with AES showed no reduction in the O, C and Ar Auger signal intensities. These results indicate that although order was restored to the surface (good LEED pattern) as a result of the laser-solid interaction, no cleaning (removal of impurities) occurred at this energy density.

The foregoing and other tests of our method indicate the general trends with respect to pulse energy density: First, the higher the energy density the greater the removal of surface impurities by the initial pulse and the higher the quality of the LEED pattern. Second, at any pulse energy density, the larger the number of pulses the more complete the removal of impurities and the higher the quality of the LEED pattern. The observations of well-defined surface structures for the laser-cleaned surfaces indicate that the epitaxial regrowth process induced by laser-melting extends to the outermost layer of the crystal. Our method is applicable to both monocrystalline and polycrystalline silicon; in the latter case, a well-ordered structure will not be obtained.

We do not wish to be bound by any particular theory as to the mechanism by which our method achieves ultra-clean, well-ordered silicon surfaces. We have established that the method will decrease the concentrations of surface impurities such as C and O, by large factors, but thus far we have not determined the ultimate fate of the impurities. It is our opinion, however, that at least part of the decrease in concentration is effected by liquid-phase diffusion of the impurities deeper into the silicon substrate. We have determined from measurements that a laser pulse of the kind utilized in Example 1 (energy density, approximately 2.0 J/cm$^2$) melts silicon to a depth of about 5000 Å. It is our opinion that in our method the laser pulses melt the irradiated surface and the underlying near-surface layer of virgin silicon, thus effecting the above-mentioned liquid-phase diffusion of surface impurities, such as oxygen and carbon, and epitaxial regrowth of the molten silicon. Some contaminants, however, are desorbed from the surface during irradiation, since a pronounced pressure rise is observed during application of the initial laser pulse.

Our method can be conducted with any suitable pulsed laser (e.g., a ruby laser or Nd-Yag laser), operated in the single mode or multimode; if desired, a homogenizer may be used. We select the laser pulse parameters to (1) effect substantially no vaporization of silicon (thus avoiding damage to the crystalline surface) and (2) effect melting of the virginal silicon immediately underlying the contaminated layer (thus promoting effective cleaning and also epitaxial regrowth of the melted silicon). For most applications, the depth of melting into the virginal silicon need not exceed approximately 3000 Å. The preferred laser pulse parameters are in the peak-power density range from about 70 MW/cm$^2$, which we consider to be near the minimum required to effect suitable melting of the silicon, to about 190 MW/cm$^2$, above which surface damage may occur. For a Q-switched ruby laser having a pulse duration of 15 nsecs, this range corresponds to an energy density from about 1.0 J/cm$^2$ to about 2.8 J/cm$^2$. Given the teaching herein, one versed in the art may determine other suitable combinations of pulse parameters, without resorting to more than routine experimentation. While appreciable cleaning may be effected with a single laser pulse, we prefer to use a plurality of pulses. If desired the various pulses may be identical.

The crystalline substrate may be baked-out before irradiation, but we have obtained atomically clean surfaces without bake-out. We prefer to conduct the irradiation under ultra-high-vacuum (UHV) conditions; however, we have achieved acceptable cleaning of off-the-shelf silicon wafers at pressures up to 10$^{-8}$ Torr; even higher pressures may be acceptable. Referring to the invention more generally, the laser treatment may be conducted in non-reactive atmospheres, meaning atmospheres at low pressures (e.g., high vacuum) and atmospheres which do not alter the character of the surface, as by chemical combination or dissolution. The determination of suitable atmospheres is well within the skill of the art.

EXAMPLE 5

It will be understood that our method also is effective for removing oxygen which is bound to the silicon surface by chemisorption processes. For example, an off-the-shelf (100) silicon sample of the kind described was cleaned by laser irradiation in UHV and a (2×1) LEED pattern was obtained. The sample then was exposed to oxygen, following which a (1×1) LEED pattern was observed and oxygen was readily detected in the Auger spectrum. After one ruby-laser pulse (15 nsecs, approximately 2 J/cm$^2$), the (2×1) surface structure reappeared and the oxygen signal was reduced by a factor of 3. After 10 such pulses, the oxygen signal was within the detection limit of the spectrometer.

We have also applied our method to oxygen- and carbon-contaminated silicon samples after they had been sputtered with argon in conventional fashion (1000 eV, 5 μA, 30 min). Observation of the sputtered sample with LEED disclosed no diffraction spots, indicating an amorphous surface region. Auger spectra for the sample before and after sputtering showed that sputtering had decreased the oxygen and carbon concentrations. The spectrum for the sputtered surface also showed the presence of embedded argon (approximately 2×10$^{15}$/cm$^2$). Irradiation in vacuum with one ruby-laser pulse (15 nsec, 2 J/cm$^2$) produced a reduction in the remaining oxygen and carbon concentrations as determined by AES. LEED patterns indicated elimination of the amorphous region and annealing of the crystal to the outermost layer. No argon was detectable by AES. After four additional pulses the O and C impurity concentrations were within the limits detectable by AES.

EXAMPLE 6

Laser-cleaning also was investigated as a means for cleaning surfaces of off-the-shelf (100) and (111) germanium samples of the p, and n types. These samples were contaminated with macro amounts of oxygen and carbon, as defined above. Irradiation was conducted in the above-described system (at pressures below approximately $2 \times 10^{-10}$ Torr) and with the same ruby laser (single mode; pulse duration, 15 nanosecs). Energy densities ranging from 1.0 J/cm$^2$ [67 MW/cm$^2$] to 2.2 J/cm$^2$ [147 MW/cm$^2$] were employed. The removal of impurities (native oxide and carbon) from the surface region of the as-inserted samples was achieved by repetitive pulsing of the same region (area: approximately 3.5 mm diameter). In a typical run conducted with a (100) sample one laser pulse [67 MW] produced a factor-of-three reduction in O and C auger signals, as compared with those for the as-inserted sample. After four more pulses on the same area, the reduced O and C signals were further decreased by a factor of four. After a total of fifteen such pulses, the O and C levels were within the detection limits of the spectrometer, and their ratios were O/Ge $\leq 2.0 \times 10^{-3}$ and C/Ge $\leq 3.5 \times 10^{-3}$. These levels correspond to surface concentrations of $\leq 0.1\%$ of a monolayer. In other words, the surface was atomically clean. Atomically clean, well-ordered surfaces were obtained in runs conducted at energy densities from 1.0 J/cm$^2$ to somewhat below 2.2 J/cm$^2$. At 2.2 J/cm$^2$ (i.e., 147 MW/cm$^2$), surface damage in the form of pits and craters (due to vaporization) was observed optically, and the LEED patterns obtained from the irradiated area were of poor quality. We consider the energy-density range from about 0.15 to 2.0 J/cm$^2$ (i.e., from about 11 to 135 MW/cm$^2$) to be suitable for removing oxygen and carbon from germanium surfaces. In our opinion, the theories advanced above with respect to the cleaning of silicon also apply to germanium.

Crystalline semiconducting wafers which have been cleaned in accordance with this method do not require an additional annealing operation before additional processing (e.g., doping) or use. They may be used in the production of microwave diodes, transistors, solar cells, and the like. Prior to use the cleaned wafers should be isolated from the atmosphere.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto. As used in the claims, the term "crystalline" includes both monocrystalline and polycrystalline.

What is claimed is:

1. A method for treating a body of crystalline silicon having a surface region which is contaminated with a macro amount of oxygen, to render said region atomically clean with respect to said oxygen, said method comprising:

in an evacuated zone, irradiating said region with a plurality of Q-switched laser pulses characterized by a peak-power density in the range of from about 70 to 190 MW/cm$^2$.

2. The method of claim 1 wherein said zone is at a pressure below about $10^{-8}$ Torr.

3. A method for treating a crystalline silicon body, a surface layer of which is contaminated with macro amounts of oxygen as SiO$_2$ and carbon to render said layer atomically clean with respect to said oxygen and carbon while avoiding damage to said layer, said method comprising:

in a zone at a pressure below about $10^{-8}$ Torr, irradiating said layer with a plurality of Q-switched laser pulses having a peak-power density in the range of from about 70 to 190 MW/cm$^2$.

4. A method for decreasing macro concentrations of oxygen and carbon present as contaminants in a surface layer of a crystalline silicon body while avoiding alteration of the crystal structure of the contaminated layer, said method comprising:

in an evacuated zone, irradiating said layer with at least one Q-switched laser pulse characterized by a peak-power density in the range of from about 70 to 190 MW/cm$^2$ to generate a melt front which moves (a) through said layer, (b) into a portion of said body immediately underlying said layer, and (c) back to said surface.

5. A method for treating a crystalline germanium body having a surface region which is contaminated with a macro amount of oxygen to render said region atomically clean with respect to said oxygen, said method comprising:

in vacuum, irradiating said region with at least one laser pulse characterized by a peak-power density in the range of from about 11 to 135 MW/cm$^2$ to effect (a) melting of said region, and (b) melting of a layer of said body immediately underlying said region.

6. A method for treating a crystalline germanium body, a surface layer of which is contaminated with macro amounts of oxygen and carbon, to render said layer atomically clean with respect to said oxygen and carbon, said method comprising:

in a zone at a pressure below about $10^{-8}$ Torr, irradiating said layer and a contiguous layer of said body with a plurality of Q-switched laser pulses having a peak-power density in the range of from about 11 to 135 MW/cm$^2$.

* * * * *